United States Patent [19]

Spencer

[11] Patent Number: 5,277,932
[45] Date of Patent: Jan. 11, 1994

[54] CVD METHOD FOR FORMING METAL BORIDE FILMS USING METAL BORANE CLUSTER COMPOUNDS

[75] Inventor: James T. Spencer, Syracuse, N.Y.

[73] Assignee: Syracuse University, Syracuse, N.Y.

[21] Appl. No.: 737,251

[22] Filed: Jul. 29, 1991

[51] Int. Cl.$^5$ .............................................. C23C 16/00
[52] U.S. Cl. .............................. 427/248.1; 427/255.1; 427/255.2; 427/126.1; 427/314; 423/287; 423/286
[58] Field of Search ............... 427/250, 255.1, 255.2, 427/248.1, 314, 123, 124, 126.1; 423/287, 286; 501/96

[56] References Cited

U.S. PATENT DOCUMENTS 4,668,538  5/1987  Feichtner et al. ............... 427/248.1

OTHER PUBLICATIONS

Wayda et al., "Low-temperature deposition of zirconium and hafnium boride films by thermal decomposition of the metal borohydrides (M[BH$_4$]$_4$)", Appl. Phys. Lett. 53(5), Aug. 1988 pp. 361–363.

Jensen et al., "Titanium, Zirconium, and Hafnium tetrahydroborates as Tailored CVD precursors for metal diboride thin films", J. Am. Chem. Soc. 1988, 110 pp. 1643 ∝ 1644.

Marks et al., "Covalent Transition Metal, Lanthanide, and Actinide Tetrahydroborate Complexes", Chem. Rev. 1977, pp. 263–293.

William N. Lipscomb, *Boron Hydrides*, W. A. Benjamin, Inc. 1963 pp. V-7.

Earl L. Muetterties, *Boron Hydride Chemistry*, Academic Press 1975 pp. V-19.

Earl L. Muetterties and Walter K. Knotch, *Polyhedral Boranes*, Marcel Dekker, Inc. 1968 pp. V-55.

Primary Examiner—Roy King
Attorney, Agent, or Firm—Wall and Roehrig

[57] ABSTRACT

Metal or metal boride films are deposited by CVD using a metal borane cluster compound as a precursor. For a nickel film, $NiCl_2$ is vaporized in a reactor tube in the presence of $B_{10}H_{14}$ or another polyborane. For an aluminum film, $Al(BH_4)_3$ is formed by reacting $AlCl_3$ with $NaBH_4$, and using the $Al(BH_4)_3$ as a precursor borane cluster compound. The substrate is heated to a selected temperature so that the deposited film has a controlled stoichiometry of metal and boron.

13 Claims, 3 Drawing Sheets

CVD METHOD FOR FORMING METAL BORIDE FILMS USING METAL BORANE CLUSTER COMPOUNDS

BACKGROUND OF THE INVENTION

This invention relates to the deposition of main group metals, such as aluminum, or of transition metals, such as nickel, either as a substantially pure metal or in combination with boron. The invention is more particularly directed to processes for deposition of metal films and boron-containing metal films which use a metal borane cluster compound as a precursor. The process of this invention can yield metal boride thin films in which the atomic percentage of boron is selected to a desired level.

The deposition of binary transition metal-main group thin-film materials of controlled stoichiometry is currently an area of intense interest. Numerous techniques have been studied for the preparation of these materials including molecular beam epitaxy (MBE), sputtering, and chemical vapor deposition (CVD). The control of the stoichiometry in multicomponent films prepared by chemical vapor deposition techniques has relied on varying the ratio of individual source components in the vapor phase. These source materials typically deposit at significantly different rates on the substrate at any given temperature, often making the formation of a homogeneous film difficult.

Nickel boride thin films have found a number of important applications, beginning with not only traditional uses such as hard cutting tools and inert coatings to protect sensitive devices from severe environmental conditions. NiB films can also be used in fields such as high-energy optical systems and magnetic materials. In addition, the incorporation of boron in nickel films has been shown greatly to enhance the strength and hardness of the alloy. Relatively strain-free nickel boride thin films have been reported from the pyrolytic CVD of gaseous mixtures of nickel tetracarbonyl, $Ni(CO)_4$, diborane, $B_2H_6$, and carbon monoxide in an argon carrier. Nickel tetracarbonyl $Ni(CO)_4$ and diborane $B_2H_6$ are relatively expensive and extremely toxic and flammable reagents. An alternative to this method which provides stoichiometric control, and yields strain-free films and conformal materials is therefore highly desirable.

The deposition of thin films of main group materials such as GaAs and $Al_xGa_{1-x}As$ using metal-organic epitaxial source materials is a subject of high interest. Research in this field has dealt primarily with the development of new epitaxial techniques and the purification of existent organometallic source materials. While these source compounds have proven adequate in many instances, further developments and improvements in epitaxial processes involving new source materials are yet to be developed which exhibit enhanced chemical properties for depositional processes. Thus far, relatively little emphasis has been placed on this vitally important aspect of epitaxial science.

Until now, metal thin film epitaxy has primarily employed deposition techniques using well-known and, typically, commercially available carbon-based source compounds. There are, however, important problems associated with the epitaxial source materials currently in use. These problems include: (1) severe substrate reactivity and bonding problems, (2) high toxicity (and environmental and occupational concerns), (3) difficulties in handling and manipulation, and (4) undesired co-deposition of carbon and other contaminant elements. In many cases, the films that derive from organometallic precursor compounds contain unacceptably high carbon levels, limiting or degrading the semiconducting properties of the film. Aluminum epitaxial depositions have typically been among the most troublesome in this latter respect. Many of the currently employed aluminum precursor compounds are particularly prone to carbon film contamination problems. With the emergence of ternary structures, such as $Al_xGa_{1-x}As$, as vital electronic materials, the development and practical application of new source materials for the deposition of aluminum is therefore an area of major concern to the electronics industry.

Several organoaluminum precursors have been carefully investigated as CVD source materials. The most intensely studied are trimethylaluminum, $Al(CH_3)_3$ (TMA), triisobutylaluminum, $Al(i-C_4H_9)_3$ (TiBA) and, most recently, the volatile donor-acceptor complexes of alane, $AlH_3(NR_3)_2$. The deposited films typically exhibit high carbon contamination and have rough surface morphologies and show significant reactor memory effects.

OBJECTS AND SUMMARY OF THE INVENTION

It is an object of the invention to provide a CVD film of metal or metal boride which avoids the problems of CVD films of the prior art.

It is another object to provide a CVD process which involves precursors that avoid inclusion of carbon or other Group IV impurities in the film.

It is a further object to provide a deposition process for formation of metallic thin films of various boron content, without having to rely on the stoichiometry of individual source components.

It is a still further object to provide a process for deposition of thin metallic or metal boride films of highly regular, smooth surface characteristics, and which can be deposited in a range of thicknesses.

According to an aspect of this invention, chemical vapor deposition of a metal or metal/boron film is carried out by forming a borane cluster compound of the metallic element. This can be the reaction product of a salt of the element with a compound such as decaborane or lithium borohydride. For aluminum deposition, borohydride sources such as $Al(BH_4)_3$ and $AlH_2(BH_4) \cdot NR_3$ can be prepared from aluminum chloride lithium borohydride. For other main-group metals, similar reactions can produce, e.g., $Sn(BH_4)_4$ or $Ge(BH_4)_4$. For a transition metal, e.g., Group IIIB (Sc,Y,La) through Group IIB (Zn, Cd, Hg) (so called d-block elements), or rare earths such as lanthanum series rare earth elements (f-block elements), metal chlorides are evaporated, and contacted with vapor of a boron hydride such as pentaborane or decaborane to produce a transient metal borohydride cluster compound.

Hydrogen as a carrier gas can accompany the cluster compound precursor, which is contacted onto a substrate. The substrate is maintained at a controlled temperature, between e.g. 100° C. and 500° C. so that the film is deposited with a desired percentage of boron present. Substantially pure metal, or metal boride film of a specific percentage of boron, is achieved. The boron level is also modulated by controlling the flow of precursor boron cluster compound and the amount of H$_2$ carrier gas. The entire substrate can be kept at the target temperature, or the temperature can be reached in selected regions, e.g. by laser writing.

The use of specifically designed borane cluster compounds which contain depositionally important elements, such as aluminum, circumvents many of the problems currently encountered with known source materials. These boron-based materials have the advantage of not containing any Group IV elements in the precursor compounds which thereby eliminates the possibility of any Group IV element incorporation into the deposited thin films as impurities.

The above and many other objects, features, and advantages of this invention will become apparent from the ensuing description of preferred embodiments of the invention, provided as an example, which description is to be read in connection with the accompanying Drawing.

DETAILED DESCRIPTION OF THE PREFERRED EMBODIMENT

Figure 1:
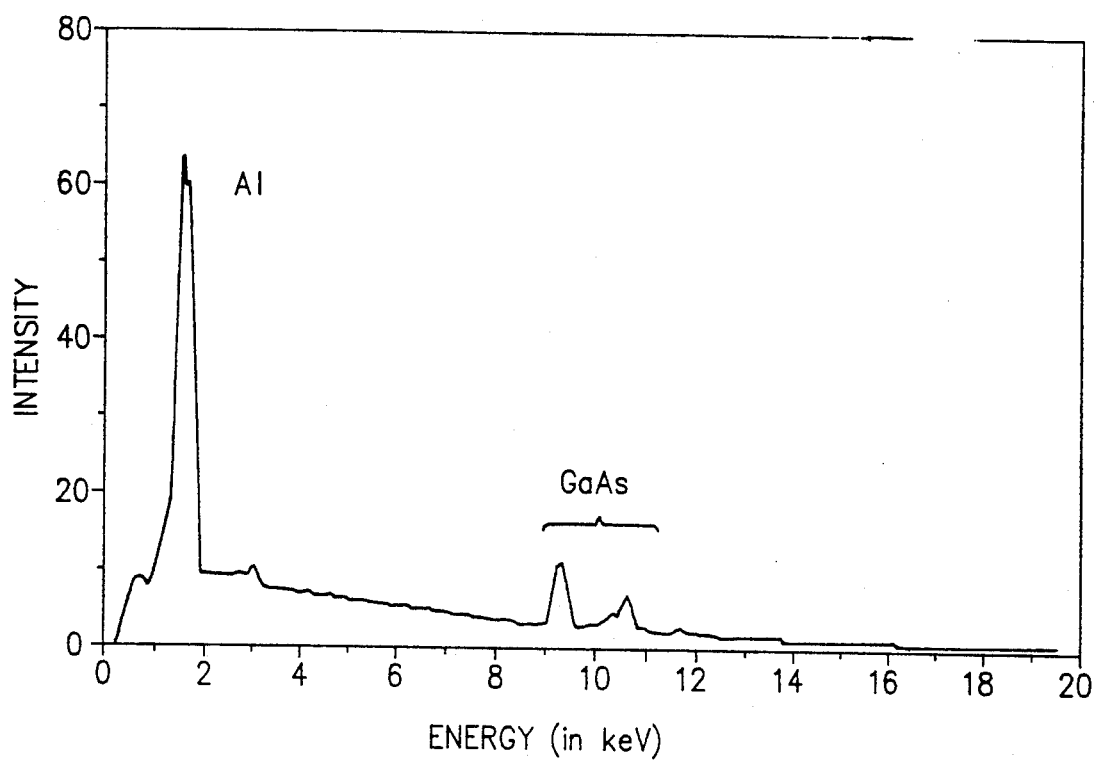
FIG. 1 is an electron microprobe analysis chart of an Al film deposited on a GaAs substrate in accordance with the process of this invention.

An example of main-group (or p-block) metal deposition according to this invention is given below in which aluminum borohydride Al(BH$_4$)$_3$ is pyrolytically deposited, and an example of a transition (or d-block) metal deposition is also given below in which nickel chloride and decaborane are vaporized to produce a nickel borohydride Ni(BH$_4$)$_2$ vapor that pyrolytically deposits a thin film of NiB in which the boron content is variable over a wide range.

For aluminum or aluminum boride deposition, either aluminum borohydride Al(BH$_4$)$_3$ or AlH$_2$(BH$_4$).NMe$_3$ is used for pyrolytic deposition and is synthesized from the reaction of aluminum chloride and lithium hydroboride. This synthesis can follow the technique described in H. I. Schlesinger, H. C. Brown, and E. K. Hyde, 75 J.Am.Chem.Soc. 209 (1953).

Depositions using this precursor material were performed in a medium-high vacuum apparatus (1×10$^{-6}$ Torr ultimate vacuum) equipped with a standard thermocouple pressure-sensing probe and a chromel-alumel thermocouple referenced to 0° C. The substrates (1 cm×2 cm) were mounted on a Mycor block and heated resistively via a tantalum wire embedded within the block. The flow of the aluminum borohydride was monitored by pressure measurements and vapor pressure calculations of the source at the temperature of the external source cooling bath. In experiments in which a hydrogen carrier gas was used, the gas was first purified using standard O$_2$ and H$_2$O scrubbers and regulated by a single needle valve into the vacuum manifold. In a typical experiment, the precursor flask was attached to the vacuum manifold and cooled in an ethanol/dry ice bath (−78° C.) with the stopcock to the main manifold closed. The main vacuum system trap, placed after the deposition chamber, was charged with dry, degassed acetone and cooled to −196° C. (to remove any unreacted precursor which might pass through the system). The entire reaction system was evacuated to 10$^{-3}$ Torr. The substrate was heated to the desired temperature and allowed to reach thermal equilibrium. The substrate may be pretreated with a brief (1-2 Sec.) exposure of anhydrous TiCl$_4$ under dynamic vacuum to facilitate the initial formation of the thin film. Once the substrate reached equilibrium, the deposition chamber was closed off by a reaction chamber bypass loop and the flows of the reactant gasses were regulated to achieve a constant flow. The bypass was then closed and the stopcock to the deposition chamber was opened. Deposition was allowed to proceed until a silvery film was observed on the substrate. The stopcock to the deposition chamber was then closed and the bypass opened. The substrate was allowed to cool slowly under vacuum to room temperature. Once at room temperature, the chamber was opened to the air and the substrate removed for further analysis.

A typical compositional analysis of the film by X-ray electron spectroscopy (XES) was employed. The substrate containing the deposited film was mounted on an aluminum stub with double-sided tape and the edges were coated using carbon paint to enhance conductivity. Compositions were determined by measuring the intensity of the aluminum signal and were interpolated using a standard XES calibration curve. The calibration was done using a key beam energy of 2.5 keV and a working distance of 25 mm. The standards used for the construction of the calibration curve were first analyzed by Auger electron spectroscopy and then the intensity of the aluminum peak was measured in XES. A plot of XES aluminum signal intensity versus percentage aluminum (by AES) gave a 98.5% (R) correlation calibration curve. The intensities of the aluminum peak in the XES for samples of unknown composition were then measured and percentages determined using the calibration plot. Data for typical films are given in the Table. The thickness measurements were made by varying the beam energy in the SEM and checking the XES for resonances due to the substrate. The energy at which the substrate signal was found to disappear was then used in the Kanaya-Okayama range formula to determine the film thickness. Films ranging in thickness from 0.1 micron to several microns have been readily prepared. Alternatively, the thickness of the films could be determined by side profile measurements in the SEM. The SEM profile measurements, however, were not as accurate as the XES method due to edge inhomogeneity and fracture problems.

Figure 2:
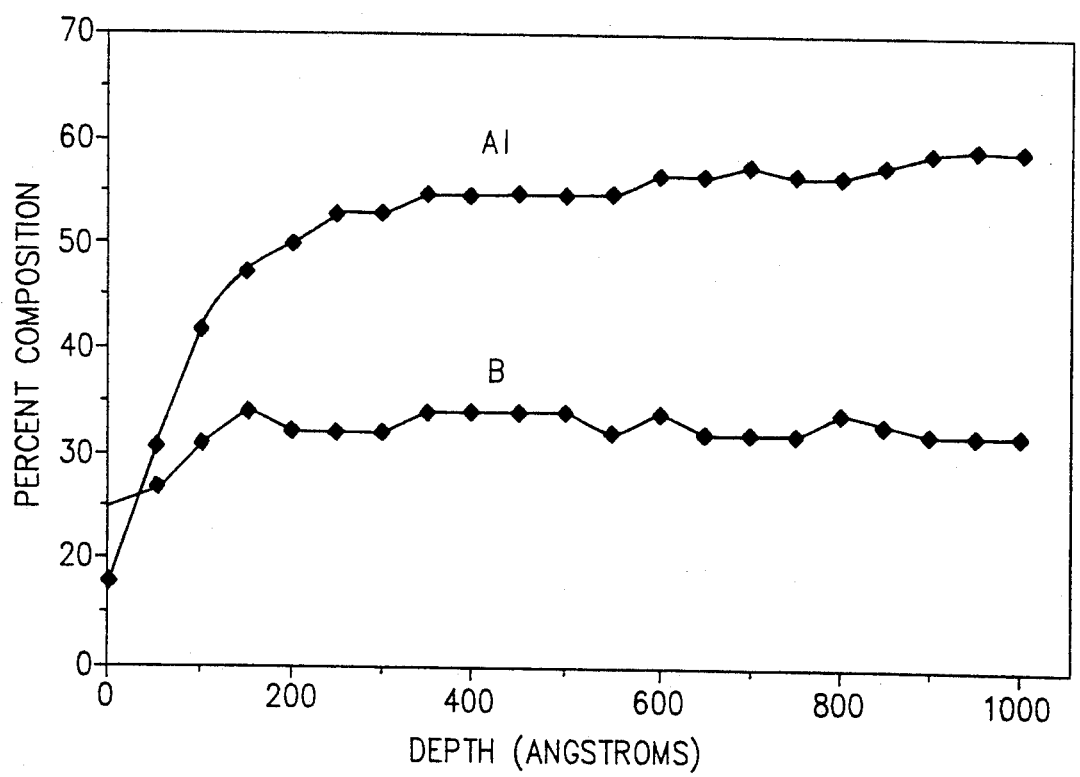
FIG. 2 is an Auger depth profile of a deposition film of this invention.
Figure 3:
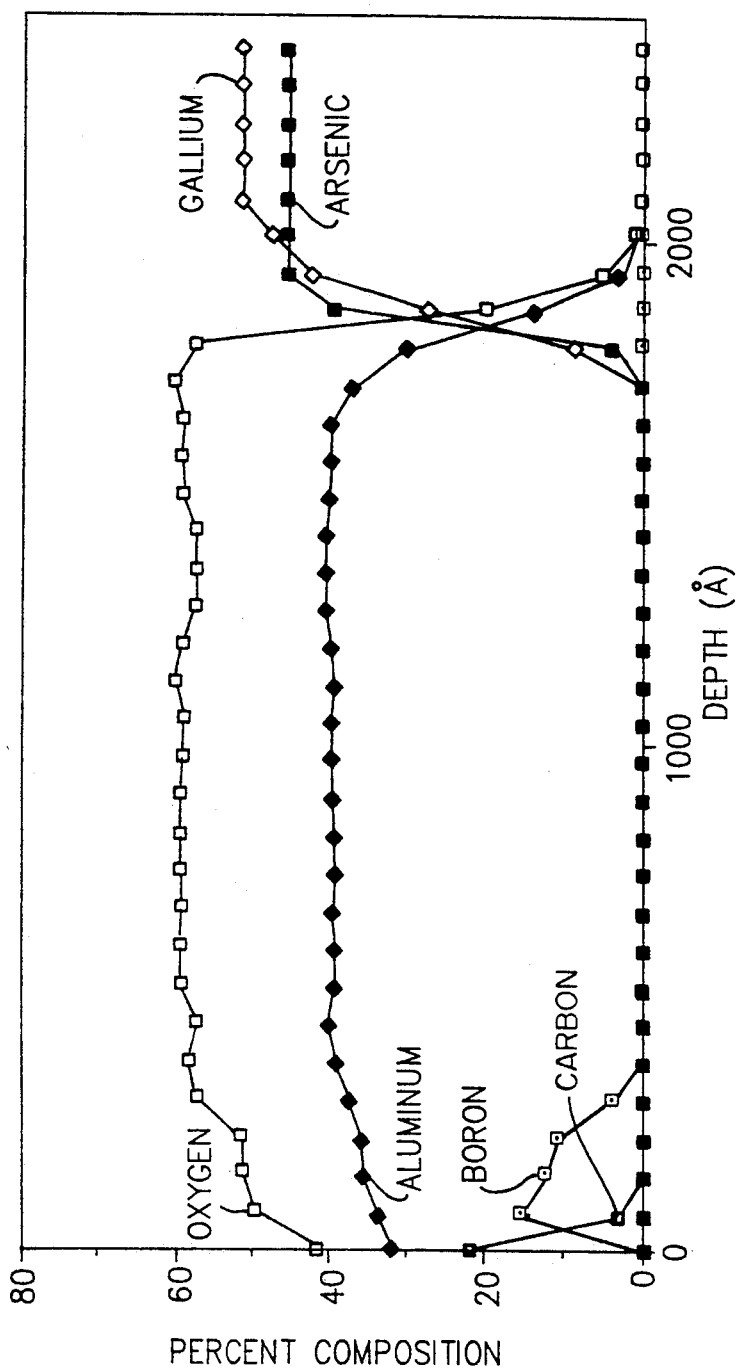
FIGS. 3 and 4 are Auger depth profiles of other deposition films of this invention.
Figure 4:
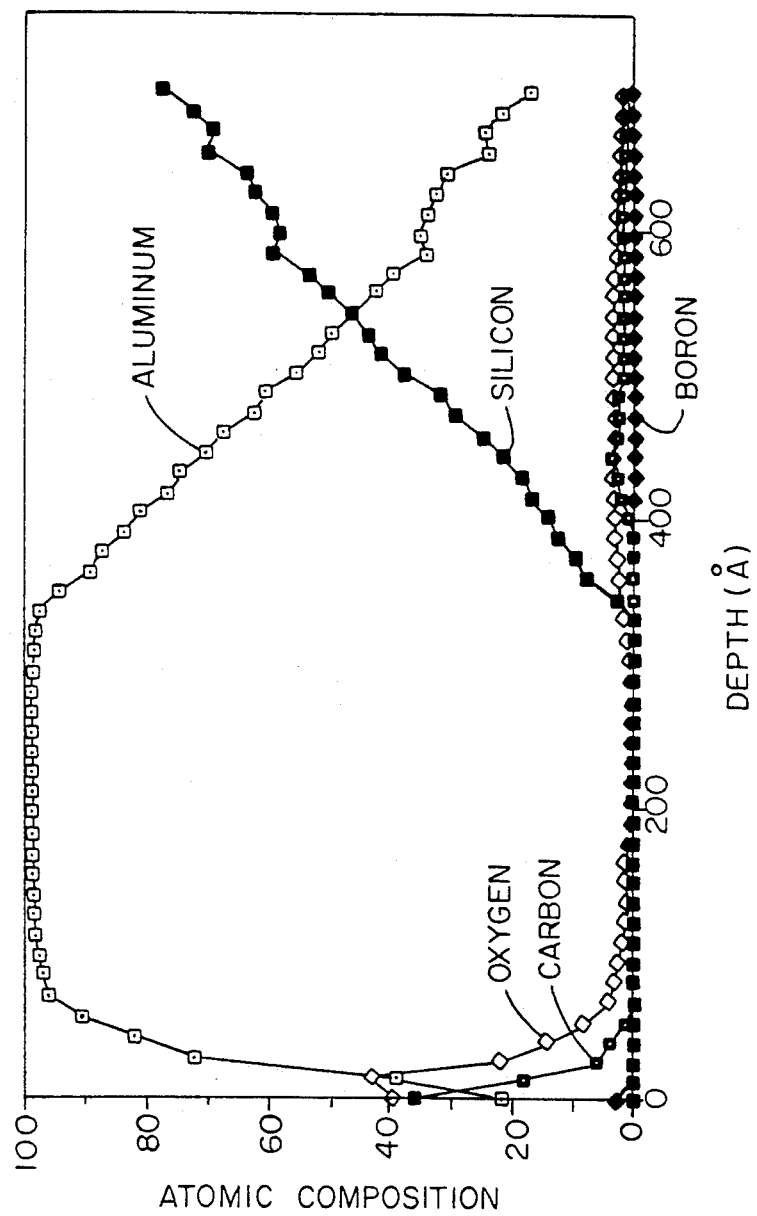

FIG. 1 shows the results of an electron microplate analysis of an AlB film produced by this invention. The film was deposited on a GaAs substrate at 367° C. by pyrolysis of aluminum borohydride Al(BH$_4$)$_3$. FIG. 2 is an Auger electron depth profile of another boron-containing aluminum thin film, here prepared by pyrolytic CVD of Al(BH$_4$)$_3$ on a copper substrate. The substrate temperature during deposition was 307° C. and the precursor reservoir was maintained at −78° C. during deposition. The depth profile was constructed from Auger electron spectra as the film was sputtered using Ar$^+$ ion milling. FIG. 3 shows an Auger electron depth profile of an aluminum (Al$_2$O$_3$) thin film, here prepared by pyrolytic CVD of Al(BH$_4$)$_3$ on a GaAS substrate with oxygen partial pressure. Similar data have been obtained for pure aluminum films, employing thermally stable AlH$_2$(BH$_4$).NR$_3$ precursor. FIG. 4 shows an Auger electron depth profile for an aluminum film deposited in high vacuum.

Experimental data for pyrolytic decomposition of aluminum borohydride on substrate at various temperatures is as shown in the following table. All experiments had a starting base pressure of $1.0 \times 10^{-3}$ Torr. The "$H_2$" column indicates presence or absence of hydrogen gas.

| Trial | Source Temp. (°C.) | Substrate Temp. (°C.) | Substrate | % Al | B[a] | $H_2$ |
|---|---|---|---|---|---|---|
| 1 | −78° C. | 332 | GaAs (100) | 24.8 | 75.2 | NO |
| 2 | −78° C. | 336 | GaAs (100) | 35.1 | 64.9 | NO |
| 3 | −78° C. | 367 | GaAs (100) | 54.5 | 45.5 | NO |
| 4 | −78° C. | 373 | GaAs (100) | 44.2 | 55.8 | YES |
| 5 | −78° C. | 407 | GaAs (100) | 40.1 | 59.9 | NO |
| 6 | −78° C. | 491 | GaAs (100) | 42.6 | 57.4 | NO |
| 7 | −78° C. | 307 | Cu | 55.5[b] | 34.1[b] | NO |
| 8 | −64° C. | 367 | Cu | 19.0[b] | 72.0[b] | NO |
| 9 | −78° C. | 428 | Cu | 49.1[b] | 33.6[b] | NO |

[a]Based on Al percentages
[b]Based on Auger Data.

A flow of $N_2/H_2$ can be maintained during deposition, and both substrate temperature and source temperature can be varied to affect the stoichiometry of B and Al.

Al(BH$_4$)$_3$ has a suitable vapor pressure for vapor deposition, and can be controlled readily by controlling the source temperature. This compound has a vapor pressure of 119.5 Torr at 0° C. In a typical deposition, the aluminum borohydride is cooled to reduce its vapor pressure and is passed over a heated substrate in a dynamic flow system. The related precursor, AlH$_2$(BH$_4$).NR$_3$ has the added advantage of being a thermally stable liquid which shows no appreciable decomposition upon standing at room temperature and which reacts only slowly with air.

If a slow aluminum boride flow is used in a 10:1 $N_2/H_2$ carrier mixture, the film surface contains spherical nodules of aluminum. When the vapor phase concentration of the aluminum borohydride is significantly increased, conformal films are obtained, i.e., where the initial spheres or modules of epitaxial growth coalesce into a uniform film. Film thicknesses between 100 angstroms and 2 microns have been prepared.

As apparent in FIG. 2, the films exhibit compositionally uniform levels of Al and B over the film thickness.

Other precursors which have been employed have the form AlH$_2$(BH$_4$).NR$_3$ or Me$_2$Al (B$_3$H$_8$) (where Me is another metallic element).

This technique applies to all main group metals, i.e., those of Groups IIIA, IVA, and VA, to wit, Al, Ga, Ge, In, Sn, Sb, Te, Pb, and Bi.

This invention has also achieved preparation of a nickel boride film using a polyborane cluster-assisted deposition (CAD) technique.

Figure 5:
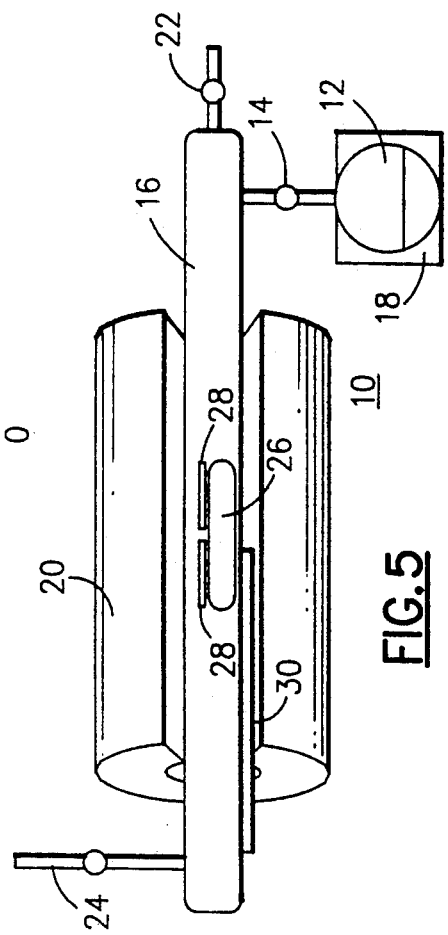
FIG. 5 is a schematic view of apparatus to practice the process of an embodiment of this invention.

For this example decaborane (B$_{10}$H$_{14}$) was employed, which was sublimed prior to use, and anhydrous nickel (II) chloride was also used. A vapor phase cluster-assisted deposition technique used the apparatus 10 shown schematically in FIG. 5. A flask 12 containing approximately 2.0 g of freshly sublimed nido-decaborane (14) is connected through a stopcock 14 to a reactor tube 16. The decaborane(14) reservoir flask 12 is maintained at room temperature by use of an external constant temperature bath 18 jacketing the flask 12. A source temperature, e.g. 21.5° C. is maintained. The reactor tube 16 is positioned within a tube furnace 20 and has an inlet 22 to a carrier gas source and an outlet 24 to the vacuum system and to liquid nitrogen traps downstream.

Nickel chloride is held in a boat 26 within the reactor tube, and one or more substrates 28 are positioned within the reactor tube adjacent the nickel chloride boat. A thermocouple 30 measures the temperature in the reactor tube 16 in the immediate vicinity of the substrates 28 and boat 26, and connects to control equipment (not shown). The entire apparatus including the flask containing the decaborane, is evacuated for 15 minutes during which time a vacuum of $1 \times 10^{-5}$ Torr is achieved. The stopcock 14 to the decaborane flask is first closed and, after 15 minutes, the reactor tube 16 is slowly heated to 555° C. under dynamic vacuum. After obtaining a stable temperature, the stopcock 14 to the decaborane flask is opened to allow a vapor of the decaborane to pass over the hot NiCl$_2$ while under dynamic vacuum conditions. Unreacted decaborane and other reaction byproducts are trapped downstream in a liquid-nitrogen-cooled trap. The deposition is continued for three hours during which time a silvery metallic thin film develops on the walls of the reactor tube 16 and on the substrates 28. The stopcock to the borane flask is then closed. The reactor tube 16 is then allowed to cool slowly from the reactor. The resulting film is a metallic, flexible, strong material. The film nickel content has been determined by atomic absorption spectrophotometry to be 88.95% nickel. X-ray electron spectroscopy analysis (XES) showed that the film contained no chloride or other heavy element contaminants. Auger electron spectroscopy further showed that the film contained only nickel and boron. Thin films of NiB with nickel contents ranging from 56.6% to 99.9% were also readily obtained using this method by varying reaction parameters such as temperature and rate of borane flow. Experimentally, nido-pentaborane, B$_5$H$_9$ has also been used with NiCl$_2$ to form NiB thin films. While pentaborane has the advantage of being a highly volatile liquid and can therefore be more easily controlled in a flow system than decaborane, decaborane has the advantage of being an air-stable material at room temperature while pentaborane reacts with the air at room temperature.

The NiB or Ni films formed by thermal reaction of NiCl$_2$ with boron hydrides using the cluster assisted process produces uniform conformal thin film materials. The films can either be adhered onto various substrates, such as copper, SiO$_2$, GaAs, or removably formed on a substrate to yield a substrate-free film. The nickel to boron ratio of the film can be selected by controlling the reactor temperature, boron flow rate, and base vacuum conditions. Nickel contents as high as 99.9% and as low as 56% have been achieved in films prepared by this technique. Annealing the NiB films at 930° C. for 40 h produces crystalline films. Scanning electron microscopy (SEM) has shown the presence of clearly defined hexagonal plates formed during the annealing process of the films.

The nickel boride alloy film has been formed to be a soft magnet, with possible applications as magnetic recording medium.

The above described technique for forming metal or metal boride films is not limited to nickel, but can employ any of the block-d metallic elements, that is Sc, Ti, V, Cr, Mn, Fe, Co, Ni, Cu, Zn or elements of those families. Also films of samarium, gadolinium or other f-block elements, i.e., lanthanum series elements can be deposited according to this technique. With block-d and block-f metals, chlorides of the metal are evaporated in a flow of decaborane or pentaborane to produce the transient metal borohydride precursor which pyrolytically decomposes on the substrate to form the metal or metal/boron film. Laser writing can be employed to effect pyrolytic deposition in a predetermined pattern.

With the technique of this invention, there are no undesired carbon or other Group IV elements included in the deposited film.

Binary metal deposits are also possible with or without incorporated boron.

While this invention has been described by reference to examples, it should be recognized that the invention is certainly not limited to them. Rather, many modifications and variations would present themselves to those skilled in the art without departing from the scope and spirit of this invention, as defined in the appended claims.

What is claimed is:

1. Process of deposition of a film of a metallic element with boron such that the metallic element has a purity of up to 99.9%, where the metallic element is a transition metal element, comprising the steps of
   forming a borane cluster compound of said metallic element by reacting a salt of said element with a polyborane, and
   contacting a vapor of said borane cluster compound, under vacuum conditions, onto a heated substrate to deposit said film thereon,
   while maintaining a temperature of said substrate to produce said film with a ratio of boron to said metallic element.

2. The process of claim 1 wherein said metallic element is a Group VIII transition metal.

3. The process of claim 1 wherein said metallic element is a member of the lanthanum series.

4. The process of claim 1 wherein said borane cluster compound is produced by reacting a halide of said metallic element with a vapor of decaborane.

5. The process of claim 1 wherein said borane cluster compound is produced by reacting a halide of said metallic element with a vapor of pentaborane.

6. The process of claim 1 wherein said temperature of said substrate and flow rate of said borane cluster compound are controlled to obtain a stoichiometric metal content in the range from about 50% to 99.9%.

7. The process of claim 1 further comprising pretreating said substrate by exposing the same to anhydrous $TiCl_4$ to facilitate the subsequent formation of said film.

8. Process of deposition of a film of a metallic element with boron such that the metallic element has a purity of up to 99.9%, where the metallic element is a main group metal element selected from the group consisting of group IIIA, group IVA, group VA and group VIA, comprising the steps of
   forming a borohydride cluster compound by reacting a salt of said metallic element with a borohydride salt, and
   contacting a vapor of said borohydride cluster compound, under vacuum conditions, onto a heated substrate to deposit said film thereon, while
   maintaining a temperature of said substrate to produce said film with a ratio of boron to said metallic element.

9. The process of claim 8 wherein said metallic element is selected from the group consisting of Al, Ga, Ge, In, Sn and Sb.

10. The process of claim 8 wherein said metallic element is Al.

11. The process of claim 8, wherein said contacting is carried out in a carrier gas of $H_2$.

12. The process of claim 8, wherein said substrate is GaAs and said temperature is in a range from substantially 300° C. to 500° C.

13. The process of claim 8 further comprising pretreating said substrate by exposing the same to anhydrous $TiCl_4$ to facilitate the subsequent formation of said film.

* * * * *